(12) United States Patent
Um et al.

(10) Patent No.: US 9,153,678 B2
(45) Date of Patent: Oct. 6, 2015

(54) POWER SEMICONDUCTOR DEVICE AND METHOD OF MANUFACTURING THE SAME

(71) Applicant: SAMSUNG ELECTRO-MECHANICS CO., LTD., Suwon (KR)

(72) Inventors: Kee Ju Um, Suwon (KR); In Hyuk Song, Suwon (KR); Chang Su Jang, Suwon (KR); Jaehoon Park, Suwon (KR); Dong Soo Seo, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 12 days.

(21) Appl. No.: 13/871,082

(22) Filed: Apr. 26, 2013

(65) Prior Publication Data

US 2014/0167150 A1     Jun. 19, 2014

(30) Foreign Application Priority Data

Dec. 14, 2012  (KR) .................. 10-2012-0146587

(51) Int. Cl.
*H01L 29/78*     (2006.01)
*H01L 29/66*     (2006.01)
*H01L 29/739*    (2006.01)
*H01L 29/06*     (2006.01)

(52) U.S. Cl.
CPC ........ *H01L 29/7397* (2013.01); *H01L 29/0688* (2013.01); *H01L 29/66348* (2013.01)

(58) Field of Classification Search
CPC ...................... H01L 29/7827; H01L 29/66666
USPC .......... 257/330, 331, 339, 341, 365; 438/589, 438/270, 271
See application file for complete search history.

(56) References Cited

U.S. PATENT DOCUMENTS

| | | | |
|---|---|---|---|
| 6,693,011 B2 * | 2/2004 | Wahl et al. ..................... | 438/270 |
| 6,841,825 B2 * | 1/2005 | Kurosaki et al. .............. | 257/330 |
| 2003/0047778 A1 | 3/2003 | Nakamura et al. | |
| 2010/0038711 A1 * | 2/2010 | Hsieh ............................. | 257/331 |
| 2012/0153382 A1 | 6/2012 | Narazaki et al. | |

FOREIGN PATENT DOCUMENTS

| | | |
|---|---|---|
| JP | 2010-177243 | 8/2010 |
| KR | 2002-0086747 | 11/2002 |
| KR | 10-2007-0011793 | 1/2007 |
| KR | 10-2009-0026747 | 3/2009 |
| KR | 10-2012-0068701 | 6/2012 |
| WO | WO 2007/106422 A2 | 9/2007 |

OTHER PUBLICATIONS

Korean Office Action mailed Nov. 25, 2013 in corresponding Korean Application No. 10-2012-0146587.

* cited by examiner

*Primary Examiner* — Sheng Zhu

(57) ABSTRACT

There is provided a power semiconductor device including a contact formed in an active region, a trench gate extendedly formed from the first region into a first termination region and formed alternately with the contact, a first conductive well formed between the contact of the active region and the trench gate, a first conductive well extending portion formed in the first termination region and a part of a second termination region, and a first conductive field limiting ring formed in the second termination region and contacting the well extending portion.

10 Claims, 4 Drawing Sheets

A-A'

B-B'

POWER SEMICONDUCTOR DEVICE AND METHOD OF MANUFACTURING THE SAME

CROSS-REFERENCE TO RELATED APPLICATIONS

This application claims the priority of Korean Patent Application No. 10-2012-0146587 filed on Dec. 14, 2012, in the Korean Intellectual Property Office, the disclosure of which is incorporated herein by reference.

BACKGROUND OF THE INVENTION

1. Field of the Invention

The present invention relates to a power semiconductor device and a method of manufacturing the same.

2. Description of the Related Art

An insulated gate bipolar transistor (IGBT) is a bipolar transistor of which a gate is formed of metal oxide silicon (MOS) and a p-type collector layer is formed on a rear surface thereof.

Since a related art power metal oxide silicon field effect transistor (MOSFET) was developed, MOSFETs have been used in fields requiring devices having high-speed switching characteristics.

However, since the MOSFET has structural limitations, a bipolar transistor, a thyristor, a gate turn-off thyristor (GTO), and the like have been used in fields requiring high voltage.

Since an IGBT has characteristics such as low forward loss and rapid switching speeds, the use of IGBTs has been expanded into applications in which a bipolar transistor, a metal oxide silicon field effect transistor (MOSFET), and the like cannot be used.

Describing an operating principle of the IGBT, when the IGBT device is turned on, a higher voltage is applied to an anode than to a cathode, and when a higher voltage than a threshold voltage of the device is applied to a gate electrode, a polarity of a surface of a p-type body region disposed below the gate electrode is inverted, and thus an n-type channel is formed.

Electronic current injected into a drift region through a channel induces an injection of hole current from a high-concentration p-type collector layer disposed below the IGBT device, similar to a base current of a bipolar transistor.

A conductivity modulation increasing conductivity in the drift region from tens of times to hundreds of times in response to the high concentration injection of minority carrier is generated.

Unlike the MOSFET, a resistance component is greatly reduced in the drift region due to the conductivity modulation, such that the IGBT may be applied to fields requiring very high voltage.

Current flowing in a cathode is divided into electronic current flowing through a channel and hole current flowing through a junction between a p-type body and an n-type drift region.

Unlike the MOSFET, in terms of a structure of a substrate, the IGBT has a pnp structure between an anode and a cathode, but does not have a diode embedded therein, such that separate diodes need to be connected to each other in an anti-parallel manner.

The IGBT has main characteristics, such as maintenance of blocking voltage, reduction in conduction loss, increase in switching speed, and the like.

With the increased magnitude in voltage required for the IGBT of the related art, there is a need to increase a durability of the device.

However, the reduction in conduction loss and the maintenance of blocking voltage have a tradeoff relationship with each other and the latch-up occurs due to the structure of the device, such that the device may be easily destructive.

That is, a need exists for a development of the IGBT capable of maintaining the blocking voltage, reducing the conduction loss, preventing the occurrence of latch-up.

The Related Art Document below relates to an insulated gate bipolar transistor (IGBT).

However, the invention disclosed in the Related Art Document below does not disclose a buried hole accumulation part as well as the reduction of conduction loss and the prevention of latch-up, and therefore is different from the present invention.

Further, the invention disclosed in the Related Art Document below does not disclose a buried hole accumulation part, and therefore is different from the present invention.

RELATED ART DOCUMENT

Korean Patent Laid-Open Publication No. 2012-0068701

SUMMARY OF THE INVENTION

An aspect of the present invention provides a power semiconductor device in which a well extending portion contacting a field limiting ring of a termination region is formed at a location at which an active region meets a termination region.

Another aspect of the present invention provides a power semiconductor device including a p-type well and a buried hole accumulation part formed below a well extending portion.

According to an aspect of the present invention, there is provided a power semiconductor device, including: a contact formed in an active region; a first conductive body layer and a second conductive emitter layer formed below the contact; a trench gate extendedly formed from the first region into a first termination region and formed alternately with the contact; a first conductive well formed between the contact of the active region and the trench gate; a first conductive well extending portion formed in the first termination region and a part of a second termination region; and a first conductive field limiting ring formed in the second termination region and contacting the well extending portion.

The power semiconductor device may further include: a high-concentration second conductive buried hole accumulation part formed below the well and the well extending portion.

An impurity concentration of the second conductive emitter layer may be higher than that of the first conductive body layer.

The power semiconductor device may further include: a comb-shaped polysilicon layer formed in the second termination region, divided into the field limiting ring and an insulating layer, and electrically connected to the trench gate.

The power semiconductor device may further include: a gate metal layer formed above the second termination region and electrically connected to the polysilicon layer; and an emitter metal layer formed in the active layer and electrically connected to the first conductive body layer and the second conductive emitter layer.

According to another aspect of the present invention, there is provided a power semiconductor device, including: a second conductive drift layer; a trench gate formed above the drift layer of an active region and a first termination region; a field limiting ring formed above the drift layer of a second termination region; a first conductive well extending portion formed above the second termination region and contacting the field limiting ring; a contact formed in the active region; and a first conductive body layer and a second conductive emitter layer formed below the contact.

The power semiconductor device may further include: a buried hole accumulation part formed at a side of the trench gate.

The power semiconductor device may further include: a comb-shaped polysilicon layer formed above the second termination region, divided into the field limiting ring and an insulating layer, and electrically connected to the trench gate.

The power semiconductor device may further include: a gate metal layer formed above the second termination region and electrically connected to the polysilicon layer; and an emitter metal layer formed in the active layer and electrically connected to the first conductive body layer and the second conductive emitter layer.

The power semiconductor device may further include: a first conductive collector layer formed below the drift layer; and a collector metal layer formed below the collector layer.

The power semiconductor device may further include: a second conductive buffer layer formed below the drift layer and contacting the collector layer.

According to another aspect of the present invention, there is provided a method of manufacturing a power semiconductor device, including: preparing a drift layer formed with a field limiting ring in a first termination region and a second termination region; forming a trench gate by forming an oxide layer above the drift layer of an active region and the second termination region using a mask and etching the oxide layer; forming a gate insulating layer on a surface of the trench gate; forming a comb-shaped polysilicon layer above the second termination region and forming a polysilicon in the trench gate; and forming a first conductive well in the active region and forming a first conductive well extending portion in the first termination region and a part of the second termination region.

The forming of the trench gate may include forming a second conductive buried hole accumulation part in the middle of the trench gate.

The method of manufacturing a power semiconductor device may further include: after the forming of the well and the well extending portion, forming a high-concentration first conductive body layer and a second conductive emitter layer in a contact.

The method of manufacturing a power semiconductor device may further include: after the forming of the body layer, forming a gate metal layer above the second termination region and electrically connected to the polysilicon layer; and forming an emitter metal layer in the active layer and electrically connected to the body layer and the emitter layer.

The method of manufacturing a power semiconductor device may further include: forming a first conductive collector layer below the drift layer; and forming a collector metal layer below the collector layer.

The method of manufacturing a power semiconductor device may further include: forming a second conductive buffer layer contacting the collector layer below the drift layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

A power switch may be implemented in any one of a power MOSFET, an IGBT, various types of thyristors, and elements similar thereto. Most new technologies disclosed herein are described with reference to an IGBT. However, various embodiments of the present invention disclosed herein are not limited to the IGBT, and therefore may be applied to other types of power switch technologies including a power MOSFET and various types of thyristor, in addition to, for example, diodes. In addition, several embodiments of the present invention are described as including specific p-type and n-type regions. However, it is natural that the embodiments of the present invention may be identically applied to devices having different conductivity-types in several regions disclosed herein.

Further, a p-type and an n-type used herein may be defined as a first conductive and a second conductivity-type. Meanwhile, the first conductive and the second conductive refer to different conductivity-types.

Further, generally, '+' refers to a high-concentration doped state and '−' refers to a low-concentration doped state.

Figure 1:
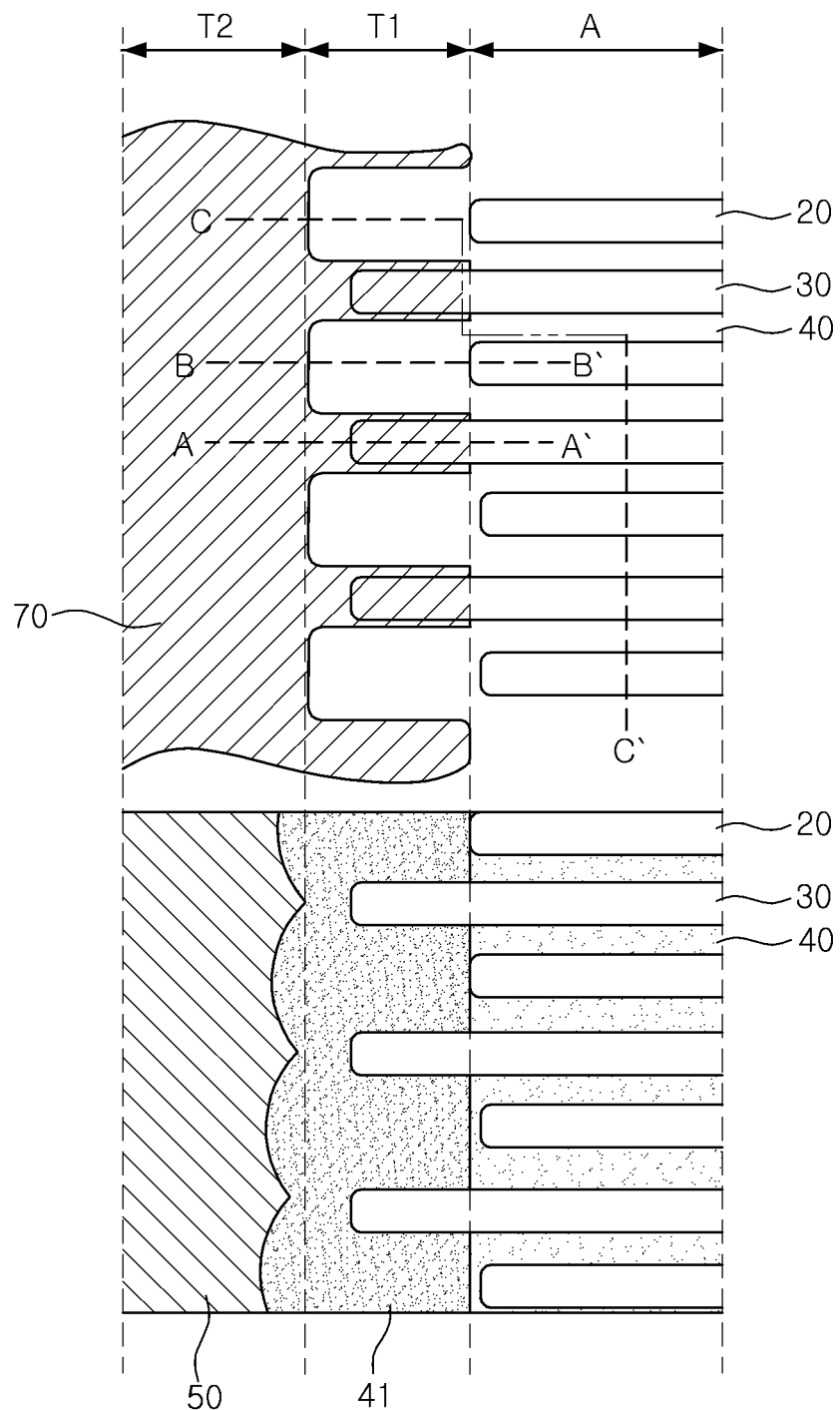
FIG. 1 is a schematic plan view of a power semiconductor device according to an embodiment of the present invention.
Figure 2:
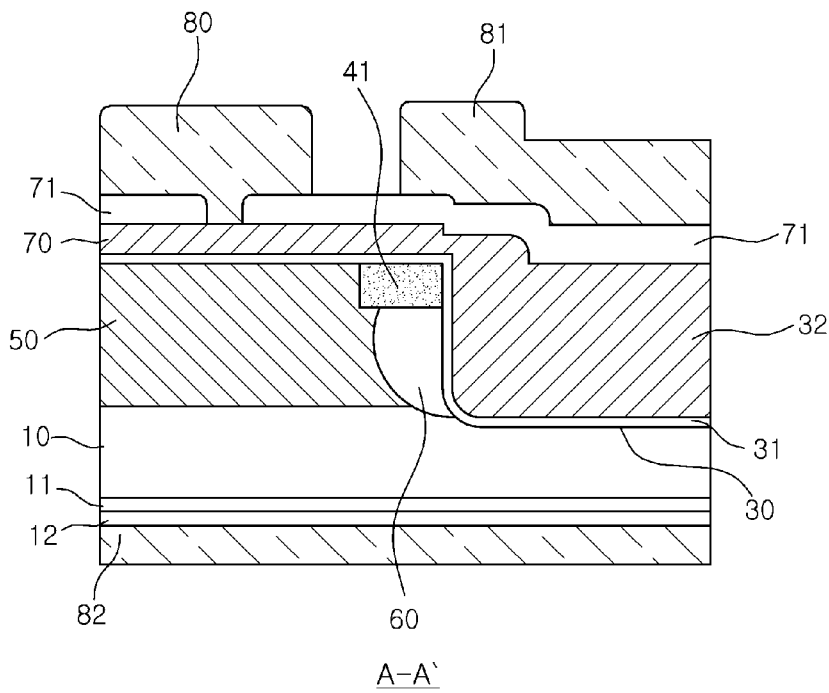
FIG. 2 is a schematic cross-sectional view taken along A-A' shown in FIG. 1.
Figure 3:
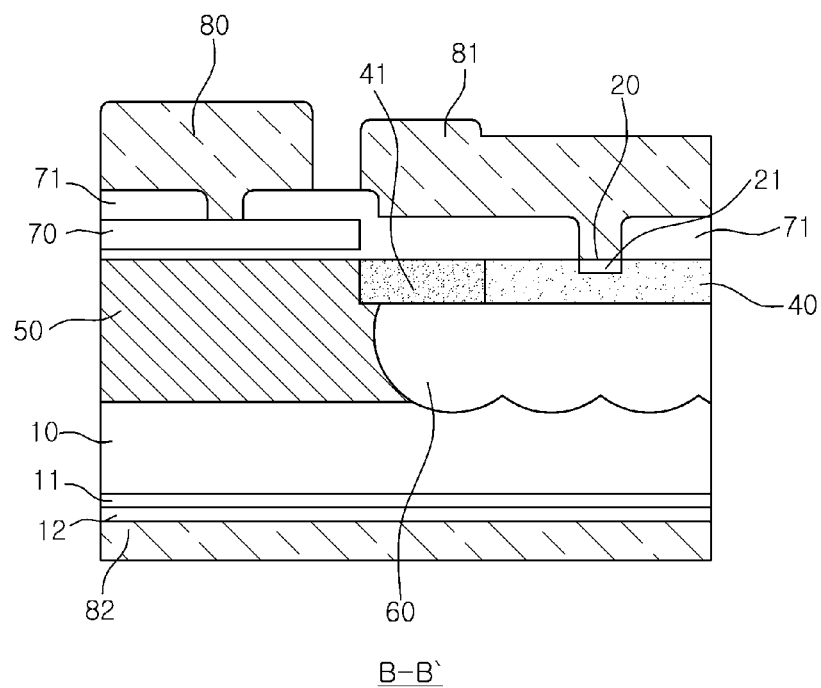
FIG. 3 is a schematic cross-sectional view taken along B-B' shown in FIG. 1.
Figure 4:
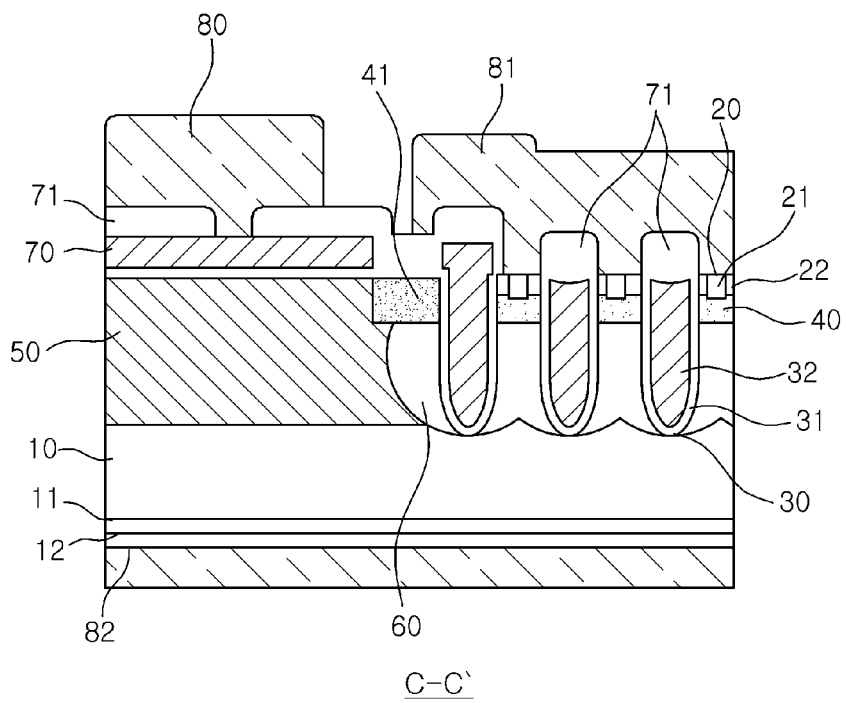
FIG. 4 is a schematic cross-sectional view taken along a dashed line other than a two-dot chain line of C-C' shown in FIG. 1.

FIG. 1 is a schematic plan view of a power semiconductor device according to an embodiment of the present invention and FIGS. 2, 3, and 4 are schematic cross-sectional views taken along line A-A', line B-B', and line C-C' of FIG. 1.

Hereinafter, the power semiconductor device according to the embodiment of the present invention will be described with reference to FIGS. 1 through 4.

The power semiconductor device according to the embodiment of the present invention may include a contact 20 formed in an active region A, a first conductive body layer 21 and a second conductive emitter layer 22 that are formed below the contact 20, a trench gate 30 extendedly formed from the active region A into a first termination region T1 and formed alternately with the contact 20, a p-type well 40 formed between the contact 20 of the active region A and the trench gate 30, a p-type well extending portion 41 formed in the first termination region T1 and a part of a second termination region T2, and a first conductive field limiting ring 50 formed in the second termination region T2 and contacting the well extending portion 41.

The contact 20 refers to a location at which an emitter metal layer 81, the body layer 21, and the emitter layer 22 are connected to one another in the power semiconductor device.

When the device is turned on, a channel is formed in the well 40 contacting the trench gate 30, such that electronic current flows in a collector layer 12 from the emitter metal layer 81.

A gate insulating layer 31 may be formed on a surface of the trench gate 30.

An inside of the trench gate 30 may be filled with a polysilicon 32.

The trench gate 30 according to the embodiment of the present invention has the gate insulating layer 31 formed on the surface thereof, and therefore is operated by forming a channel in the well 40 when voltage is applied to the trench gate 30.

That is, when a higher voltage than a threshold voltage of the device is applied to a gate metal layer 80 electrically connected to the polysilicon 32 in the trench gate 30, a polarity of a surface of the well 40 contacting the trench gate 30 is inverted to form an n-type channel, such that the power semiconductor device is operated as a transistor.

The power semiconductor device may further include a high-concentration second conductive buried hole accumulation part 60 formed below the well 40 and the well extending portion 41.

A potential barrier is formed so as to accumulate hole injected from the p-type collector layer 12 by forming the buried hole accumulation part 60.

As such, a conductivity modulation phenomenon may suddenly occur due to the accumulated holes, such that the reduction in conduction loss of about 70% or more, as compared with existing case, may be achieved.

However, the blocking voltage of the IGBT is reduced due to the high-concentration buried hole accumulation part (60) layer.

In particular, the buried hole accumulation part 60 is connected to the trench gate electrode in the active region A, such that the active region A is less affected by the reduction in blocking voltage, but the reduction in blocking voltage may occur at a location at which the termination regions T1 and T2 meet the active region A due to the buried hole accumulation part (60) layer.

Figure 5:
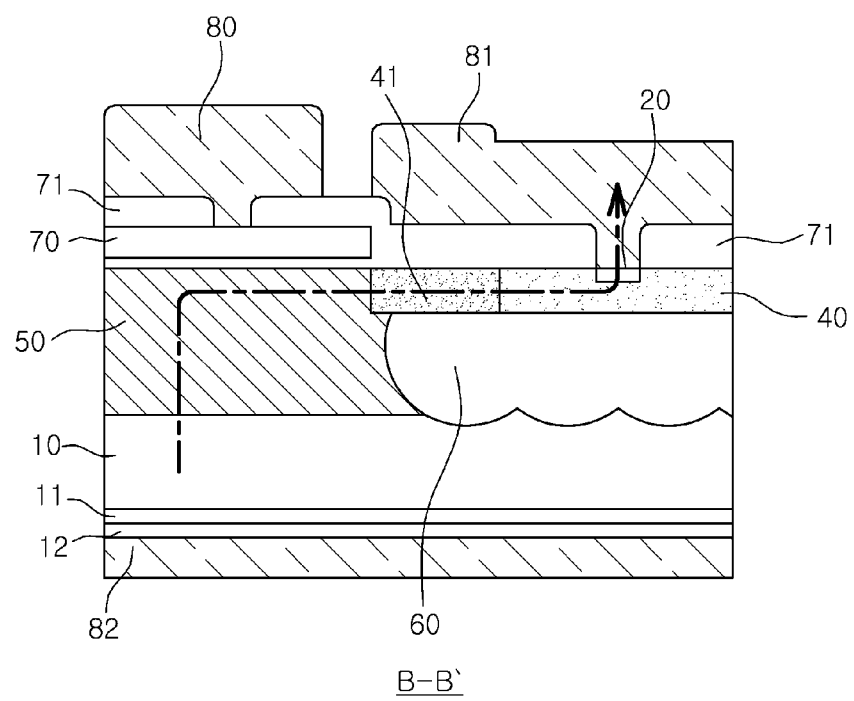
FIG. 5 is a schematic cross-sectional view illustrating a flow of hole of the power semiconductor device according to the embodiment of the present invention.

Further, referring to FIG. 5, when the well extending portion 41 is not present, the buried hole accumulation part 60 encroaches on the p-type well at a location at which the active region A meets the termination regions T1 and T2 when the buried hole accumulation part 60 is formed, such that the hole generated at the termination regions flows in the emitter metal layer 81 through the buried holed accumulation 60.

In this case, the hole flows through the p-type collector layer 12, the n-type drift layer 10, the p-type field limiting ring 50, and the n-type buried hole accumulation part, such that the latch-up occurs.

Latch-up refers to a phenomenon in which the device is burned to be broken due to a vast amount of current flowing between a cathode and an anode, since the IGBT is no longer controlled by the gate when a pnpn thyristor structure is present in the IGBT device of the related art and thus a parasitic thyristor is operated.

Therefore, the well extending portion 41 is formed in the first termination region T1 and a part of the second termination region T2 and thus is formed to contact the field limiting ring 50 to prevent latch-up from occurring.

That is, holes flow in the emitter metal layer 81 through the p-type collector layer 12, the n-type drift layer 10, the p-type field limiting ring 50, and the p-type well extending portion 41 in a direction of an arrow illustrated in FIG. 5 to prevent latch-up from occurring.

The power semiconductor device may further include the high-concentration first conductive body layer 21 and second conductive emitter layer 22 that are formed below the contact 20.

As described above, since the concentration of the p-type well 40 for forming the channel region affects the threshold voltage, the high-concentration p-type body layer 21 is separately formed at the center to improve latch-up characteristics.

Among the main characteristics of the IGBT, the blocking voltage is basically determined by the thickness and the impurity concentration of the drift layer 10.

In order to improve the blocking voltage, there is a need to increase the thickness and reduce the impurity concentration. In this case, Vce (sat) of the IGBT is increased, and thus the optimization of conditions is required.

Therefore, the field limiting ring 50 is formed on an edge of the device so as to relieve the concentration of an electric field and maintain the blocking voltage.

The power semiconductor device may further include a comb-shaped polysilicon layer 70 formed in the second termination region T2, divided into the field limiting ring 50 and the insulating layer 71 and electrically connected to the trench gate 30.

The polysilicon layer 70 is electrically connected to the polysilicon 32 of the trench gate 30 to enable the turn on/off operation of the device.

The polysilicon layer 70 is formed in the second termination region T2 and may be formed in a comb shape so as to be electrically connected to the trench gate 30 of the first termination region.

That is, the polysilicon layer 70 is not formed between the adjacent trench gates 30 of the first termination region.

The polysilicon layer 70 is formed in a comb shape, such that the p-type well 40 and the p-type well extending portion 41 may be formed between the adjacent trench gates 30 of the active region A and the first termination region.

That is, the polysilicon layer serves as a mask during the process of injecting the p-type impurity, such that the p-type impurity may be injected only into a place at which the polysilicon layer 70 is not present.

As described above, the p-type impurity is injected and then subjected to the heat treatment to diffuse the injected impurity, such that the p-type well extending portion 41 may contact the field limiting ring 50.

The power semiconductor device may further include the gate metal layer 80 formed above the second termination region T2 and electrically connected to the polysilicon layer 70, and the emitter metal layer 81 formed in the active region A and electrically connected to the body layer 21 and the emitter layer 22.

Hereinafter, a section of the power semiconductor device according to the embodiment of the present invention will be described with reference to FIGS. 2 through 4.

The power semiconductor device may include the second conductive drift layer 10, the trench gate 30 formed above the drift layer 10 of the active region A and the first termination region T1, the field limiting ring 50 formed above the drift layer 10 of the second termination region T2, the first conductive well extending portion 41 formed above the second termination region T2 and contacting the field limiting ring 50, the contact formed in the active region, and the first conductive body layer 21 and the second conductive emitter layer 22 that are formed below the contact 20.

The power semiconductor device may include the buried hole accumulation part 60 formed on the side of the trench gate 30.

Referring to FIGS. 2 to 4, the buried hole accumulation part 60 may be formed below the well 40 and the well extending portion 41.

Therefore, the buried hole accumulation part 60 may allow holes passing through the drift layer 10 to be accumulated therein while preventing the holes from exiting to induce the conductivity modulation phenomenon, thereby suddenly reducing the conduction loss.

The power semiconductor device may further include the comb-shaped polysilicon layer 70 formed above the second termination region T2, divided into the field limiting ring 50 and the insulating layer 71 and electrically connected to the trench gate 30.

The polysilicon layer 70 is formed in the second termination region T2 and may be formed in a comb shape so as to be electrically connected to the trench gate 30 of the first termination region.

That is, the polysilicon layer 70 is not formed between the adjacent trench gates 30 of the first termination region.

The polysilicon layer 70 is formed in a comb shape, such that the p-type well 40 and the p-type well extending portion 41 may be formed between the adjacent trench gate 30 of the active region A and the first termination region.

That is, the polysilicon layer serves as a mask during the process of injecting the p-type impurity, such that the p-type impurity may only be injected into a place at which the polysilicon layer 70 is not present.

As described above, the p-type impurity is injected and then the heat treatment is performed to diffuse the injected impurity, such that the p-type well extending portion 41 may contact the field limiting ring 50.

The power semiconductor device may further include the gate metal layer 80 formed above the second termination region T2 and electrically connected to the polysilicon layer 70 and the emitter metal layer 81 formed in the active region A and electrically connected to the body layer 21 and the emitter layer 22.

The power semiconductor device may further include the p-type collector layer 12 formed below the drift layer 10 and a collector metal layer 82 formed below the collector layer 12.

The power semiconductor device may further include a second conductive buffer layer 11 formed below the drift layer 10 and contacting the collector layer 12.

The buffer layer 11 may serve as a field stop.

Therefore, in the power semiconductor device according to the embodiment of the present invention, the drift layer 10 may be formed to be relatively thin under the same blocking voltage condition, as compared with the case in which there is no buffer layer 11.

FIGS. 6A through 6J are diagrams illustrating a process of manufacturing a power semiconductor device according to another embodiment of the present invention.

Referring to FIGS. 6A through 6J, a method of manufacturing a power semiconductor device according to another embodiment of the present invention may include preparing the drift layer 10 formed with the field limiting ring 50 in the first termination region T1 and the second termination region T2 (FIG. 6A), forming the trench gate 30 by forming an oxide layer above the drift layer 10 of the active region A and the second termination region T2 using the mask and then etching the oxide layer (FIGS. 6B through 6D), forming the gate insulating layer 31 on the surface of the trench gate 30 (FIG. 6E), forming the comb-shaped polysilicon layer 70 above the second termination region T2 and forming the polysilicon 32 in the trench gate 30 (FIG. 6F), and forming the p-type well 40 in the active region A and the p-type well extending portion 41 in the first termination region T1 and a part of the second termination region T2.

Describing the forming of the well extending portion 41 in detail, the p-type impurity is injected onto the device.

The comb-shaped polysilicon layer 70 is formed above the second termination region T2, such that the p-type impurity is injected into a part at which the comb-shaped polysilicon layer 70 is not formed.

Therefore, the p-type impurity is injected into both sides of the trench gate 30 of the first termination region T1.

The well extending portion 41 is formed at an end of the trench gate 30 by heat-treating the device injected with the p-type impurity and diffusing the p-type impurity, and thus may contact the field limiting ring 50.

In the forming of the trench gate, the second conductive buried hole accumulation part 60 is formed in the middle of the trench gate.

The buried hole accumulation part 60 may be formed via an additional process in addition to the forming of the trench gate.

Figure 6A:
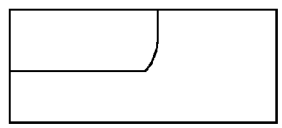
FIGS. 6A through 6J are diagrams illustrating a process of manufacturing a power semiconductor device according to another embodiment of the present invention.
Figure 6G:
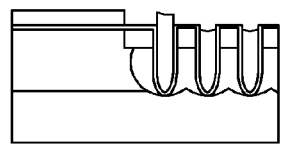
Figure 6B:
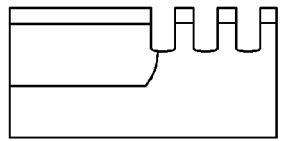

The forming of the buried hole accumulation part 60 may include etching the trench gate 30 so that a depth of the trench gate 30 is a half of the final depth (FIG. 6B), injecting the high-concentration n-type impurity into the etched trench gate 30 (FIG. 6C), etching the trench gate 30 injected with the impurity so that the depth of the trench gate 30 becomes the final depth (FIG. 6D), and heat-treating the device formed with the trench gate to diffuse the n-type impurity (FIG. 6G).

The heat treatment of the buried hole accumulation part and the well extending portion 41 may be performed simultaneously.

Figure 6H:
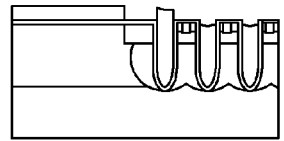
Figure 6C:
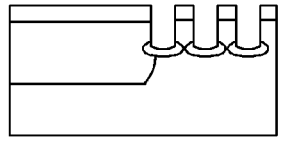

The method of manufacturing a power semiconductor device may further include forming the high-concentration p-type body layer 21 and n-type emitter layer 22 in the contact 20 after the forming of the well 40 and the well extending portion 41 (FIG. 6H).

The body layer 21 may be formed by injecting the high-concentration p-type impurity.

Figure 6I:
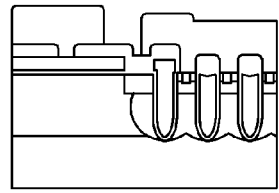
Figure 6D:
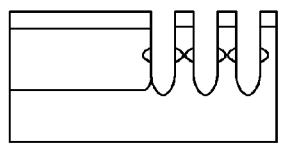
Figure 6E:
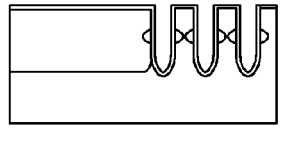

The method of manufacturing a power semiconductor device may further include forming the gate metal layer 80 above the second termination region T2 and electrically connected to the polysilicon layer 70 after the forming of the body layer 21 (FIG. 6I), and forming the emitter metal layer 81 formed in the active region A and electrically connected to the body layer 21 and the emitter layer 22 (FIG. 6I).

Figure 6J:
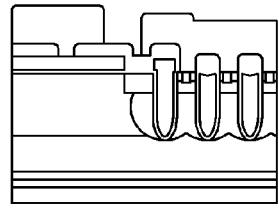
Figure 6F:
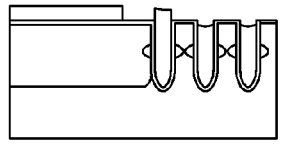

The method of manufacturing a power semiconductor device may further include forming the p-type collector layer 12 below the drift layer 10 (FIG. 6J) and forming the collector metal layer 82 below the collector layer 10 (FIG. 6J).

The method of manufacturing a power semiconductor device may further include forming the n-type buffer layer 11 below the drift layer 10 (FIG. 6J).

As set forth above, according to the embodiments of the present invention, the power semiconductor device capable of reducing the conduction loss while maintaining the blocking voltage may be provided.

Further, according to the embodiment of the present invention, the power semiconductor device capable of preventing the occurrence of the latch-up while reducing the conduction loss and maintaining the blocking voltage may be provided.

While the present invention has been shown and described in connection with the embodiments, it will be apparent to those skilled in the art that modifications and variations can be made without departing from the spirit and scope of the invention as defined by the appended claims.

What is claimed is:

1. A power semiconductor device, comprising:
 a contact formed in an active region;
 a first conductive body layer and a second conductive emitter layer formed below the contact;
 a trench gate extendedly formed from the active region into a first termination region and formed alternately with the contact;
 a first conductive well formed between the contact of the active region and the trench gate;
 a first conductive well extending portion formed in the first termination region and a part of a second termination region;
 a first conductive field limiting ring formed in the second termination region and contacting the first conductive well extending portion; and
 a high-concentration second conductive buried hole accumulation part formed below the first conductive well and the first conductive well extending portion,
 the high-concentration second buried hole accumulation part being formed to cover at least a portion of a side surface of the trench gate.

2. The power semiconductor device of claim 1, wherein an impurity concentration of the second conductive emitter layer is higher than that of the first conductive body layer.

3. The power semiconductor device of claim 1, further comprising a comb-shaped polysilicon layer formed in the second termination region, divided into the field limiting ring and an insulating layer, and electrically connected to the trench gate.

4. The power semiconductor device of claim 3, further comprising:
 a gate metal layer formed above the second termination region and electrically connected to the comb-shaped polysilicon layer; and
 an emitter metal layer formed in an active layer and electrically connected to the first conductive body layer and the second conductive emitter layer.

5. The power semiconductor device of claim 1, wherein the high-concentration second buried hole accumulation part being formed to contact at least a portion of a side surface of the trench gate.

6. A power semiconductor device, comprising:
 a second conductive drift layer;
 a trench gate formed in an active region and a first termination region and located above the second conductive drift layer;
 a field limiting ring formed in a second termination region and located above the second conductive drift layer;
 a first conductive well extending portion formed above the second termination region and contacting the field limiting ring;
 a contact formed in the active region;
 a first conductive body layer and a second conductive emitter layer formed below the contact; and
 a buried hole accumulation part formed at a side of the trench gate,
 the buried hole accumulation part being formed to cover at least a portion of a side surface of the trench gate.

7. The power semiconductor device of claim 6, further comprising a comb-shaped polysilicon layer formed above the second termination region, divided into the field limiting ring and an insulating layer, and electrically connected to the trench gate.

8. The power semiconductor device of claim 7, further comprising:
 a gate metal layer formed above the second termination region and electrically connected to the polysilicon layer; and
 an emitter metal layer formed in the active layer and electrically connected to the first conductive body layer and the second conductive emitter layer.

9. The power semiconductor device of claim 8, further comprising:
 a first conductive collector layer formed below the second conductive drift layer; and
 a collector metal layer formed below the collector layer.

10. The power semiconductor device of claim 9, further comprising a second conductive buffer layer formed below the second conductive drift layer and contacting the collector layer.

* * * * *